United States Patent
Lin et al.

(10) Patent No.: US 9,881,809 B2
(45) Date of Patent: Jan. 30, 2018

(54) SEMICONDUCTOR DEVICE AND METHOD OF FABRICATING THE SAME

(71) Applicant: MACRONIX International Co., Ltd., Hsinchu (TW)

(72) Inventors: Xin-Guan Lin, Hsinchu (TW); Hong-Ji Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/681,988

(22) Filed: Apr. 8, 2015

(65) Prior Publication Data

US 2016/0300761 A1    Oct. 13, 2016

(51) Int. Cl.
| | | |
|---|---|---|
| H01L 23/48 | (2006.01) | |
| H01L 21/311 | (2006.01) | |
| H01L 21/3213 | (2006.01) | |
| H01L 23/485 | (2006.01) | |
| H01L 21/768 | (2006.01) | |
| H01L 23/532 | (2006.01) | |

(52) U.S. Cl.
CPC .. *H01L 21/31111* (2013.01); *H01L 21/32136* (2013.01); *H01L 21/32139* (2013.01); *H01L 21/76805* (2013.01); *H01L 23/485* (2013.01); *H01L 23/53223* (2013.01); *H01L 23/53266* (2013.01); *H01L 23/53271* (2013.01)

(58) Field of Classification Search
CPC ............... H01L 21/76843; H01L 21/31111
USPC ................................................ 257/770
See application file for complete search history.

(56) References Cited

U.S. PATENT DOCUMENTS

| | | | | |
|---|---|---|---|---|
| 7,435,681 | B2 * | 10/2008 | Lee | H01L 21/31116 257/E21.218 |
| 2008/0042290 | A1 * | 2/2008 | Lee | H01L 21/76804 257/760 |
| 2009/0029543 | A1 * | 1/2009 | Rothwell | H01L 21/02063 438/631 |
| 2010/0301491 | A1 * | 12/2010 | Yang | H01L 21/02063 257/773 |
| 2012/0170887 | A1 * | 7/2012 | Yang | G02B 6/132 385/14 |

FOREIGN PATENT DOCUMENTS

| | | |
|---|---|---|
| TW | 200741961 | 11/2007 |
| TW | 201025503 | 7/2010 |

OTHER PUBLICATIONS

"Office Action of Taiwan Counterpart Application", dated Jun. 13, 2016, p. 1-p. 4.

* cited by examiner

*Primary Examiner* — Ajay K Arora
(74) *Attorney, Agent, or Firm* — J.C. Patents

(57) ABSTRACT

A method of fabricating a semiconductor device is provided. A dielectric layer is formed on a barrier layer. A first opening is formed in the dielectric layer and exposes a portion of the barrier layer. A protection layer is formed on the barrier layer at the bottom of the first opening. The protection layer is thicker at the central portion while thinner at the edge portion thereof. A portion of the exposed barrier layer is removed by using the protection layer as a mask to form a second opening. The second opening has at least one sub-opening disposed in the barrier layer adjacent to the sidewall of the second opening. A semiconductor device formed with the method is also provided.

4 Claims, 4 Drawing Sheets

SEMICONDUCTOR DEVICE AND METHOD OF FABRICATING THE SAME

BACKGROUND OF THE INVENTION

Field of Invention

The present invention relates to a semiconductor technology, and more generally to a semiconductor device and a method of fabricating the same.

Description of Related Art

Etching is a critically important process module, and two major types of etching are wet etching and dry etching. In a dry etching process, the reaction gases in the chamber are ionized to generate a plasma, the reactive ions are accelerated toward a wafer, and an etching is conducted through a chemical reaction between the ions and the material to be etched on the surface of the wafer.

Currently, in order to improve the throughput of a production machine, a high power plasma is required to increase the etching rate. However, when a high power plasma etching process is conducted to form a via opening or a contact opening, a metal layer at the bottom of the opening is easily sputtered onto the sidewall of the opening. Thus, the undesired residues such as metal polymers are generated on the sidewall of the opening. Such residues are hardly removed in the subsequent processes, so an abnormal turn-on and therefore a short are observed in the semiconductor device.

SUMMARY OF THE INVENTION

The present invention provides a semiconductor device and a method of fabricating the same, in which residues are not observed on the sidewall of the opening during the opening defining step.

The present invention provides a method of fabricating a semiconductor device. A dielectric layer is formed on a barrier layer. A first opening is formed in the dielectric layer and exposes a portion of the barrier layer. A protection layer is formed on the barrier layer at the bottom of the first opening. The protection layer is thicker at the central portion while thinner at the edge portion thereof. A portion of the exposed barrier layer is removed by using the protection layer as a mask to form a second opening. The second opening has at least one sub-opening disposed in the barrier layer adjacent to the sidewall of the second opening.

According to an embodiment of the present invention, a bottom of the second opening has a W-shaped cross section.

According to an embodiment of the present invention, a thickness of the barrier layer at a central bottom of the second opening is greater than a thickness of the barrier layer below the sub-opening.

According to an embodiment of the present invention, the protection layer covers a portion of the barrier layer while exposes another portion of the barrier layer adjacent to the sidewall of the second opening.

According to an embodiment of the present invention, a method of forming each of the first opening and the second opening includes performing a plasma etching process.

According to an embodiment of the present invention, etching gases used in the step of forming the first opening include nitrogen, and a nitrogen flow rate is increased as the first opening is deepened.

According to an embodiment of the present invention, etching gases used in the step of forming the second opening include $SF_6$, $NF_3$, Ar, $C_xF_y$ and nitrogen, wherein each of x and y is greater than zero.

According to an embodiment of the present invention, a flow rate ratio of nitrogen to $C_xF_y$ is about 1:6 to 1:4.

According to an embodiment of the present invention, the protection layer includes a polymer containing carbon, fluorine and nitrogen.

According to an embodiment of the present invention, during the step of forming the first opening in the dielectric layer, the protection layer is simultaneously formed at the bottom of the first opening.

According to an embodiment of the present invention, before the step of forming the first opening in the dielectric layer, the method further includes forming a shallow opening in the dielectric layer, and performing an anisotropic etching process, so as to deepen the shallow opening and therefore form the first opening in the dielectric layer.

According to an embodiment of the present invention, a depth of the shallow opening is about ½ to ⅘ of a thickness of the dielectric layer.

According to an embodiment of the present invention, a method of forming the shallow opening includes performing an anisotropic etching process, and gases used in the step of forming the shallow opening do not include nitrogen.

According to an embodiment of the present invention, the method further includes removing the protection layer, and forming a conductive layer in the second opening.

The present invention further provides a semiconductor device including a barrier layer and a dielectric layer. The dielectric layer is disposed on the barrier layer. The dielectric layer has an opening therein, and the opening exposes a portion of the barrier layer. The opening has at least one sub-opening disposed in the barrier layer adjacent to a sidewall of the opening.

According to an embodiment of the present invention, a bottom of the opening has a W-shaped cross section.

According to an embodiment of the present invention, a thickness of the barrier layer at a central bottom of the opening is greater than a thickness of the barrier layer below the sub-opening.

According to an embodiment of the present invention, a thickness of the barrier layer below the dielectric layer is greater than a thickness of the barrier layer at a central bottom of the opening.

According to an embodiment of the present invention, a depth of the sub-opening ranges from about 4,000 Å to 12,000 Å.

According to an embodiment of the present invention, the barrier layer includes Ti, TiN, Ta, TaN, W, WN or a combination thereof.

In view of the above, in the method of the invention, an etching process is conducted to form a U-shaped opening, and a protection layer is simultaneously formed on the barrier layer at the bottom of the U-shaped opening. The said etching process is continued by using the protection layer as a mask and the nitrogen flow rate is adjusted, and a W-shaped opening is thus formed. The protection layer can prevent the barrier layer from being sputtered onto the sidewall of the opening when a high RF power plasma is used. Thus, residues are not observed on the sidewall of the opening, and the device performance is accordingly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
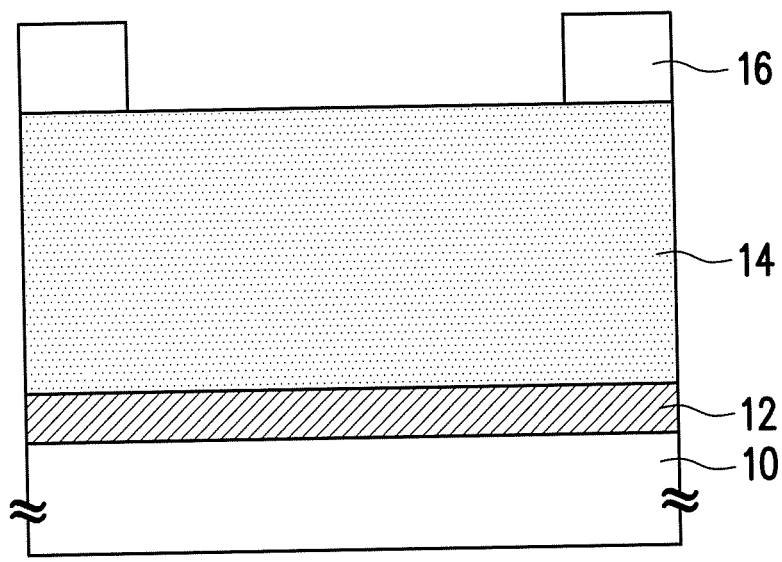
FIG. 1A to FIG. 1G are schematic cross-sectional views of a method of fabricating a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views of a method of fabricating a semiconductor device according to an embodiment of the present invention.

Referring to FIG. 1A, a substrate 10 is provided. The substrate 10 can include a semiconductor material, an insulating material, a conductive material or a combination thereof. The substrate 10 includes at least one material selected from the group consisting of Si, Ge, SiGe, GaP, GaAs, SiC, SiGeC, InAs and InP. In an embodiment, the substrate 10 includes Si or SiGe. Besides, the substrate 10 can be a single-layer structure. Alternatively, the substrate 10 can be a multi-layer structure including a conductive layer, a dielectric layer, a gate structure etc.

Thereafter, a barrier layer 12 is formed on the substrate 10. The barrier layer 12 includes Ti, TiN, Ta, TaN, W, WN or a combination thereof. In an embodiment, the barrier layer 12 includes a combination of Ti and TiN. In another embodiment, the barrier layer 12 includes a combination of Ta and TaN. The method of forming the barrier layer 12 includes performing a chemical vapour deposition (CVD) process or physical vapour deposition (PVD). The barrier layer 12 has a thickness of about 300 Å to 1,000 Å, for example.

Afterwards, a dielectric layer 14 is formed on the barrier layer 12. The dielectric layer 14 includes oxide, nitride, oxynitride or a combination thereof. In an embodiment, the dielectric layer 14 includes silicon oxide. In another embodiment, the dielectric layer 14 can include a dielectric material with a dielectric constant less than 4. The method of forming the dielectric layer 14 includes performing a thermal oxidation process or a CVD process. The dielectric layer 14 has a thickness of about 1,000 Å to 15,000 Å, for example. Then, a patterned mask layer 16 is formed on the dielectric layer 14. The patterned mask layer 16 includes a photoresist material.

Figure 1B:
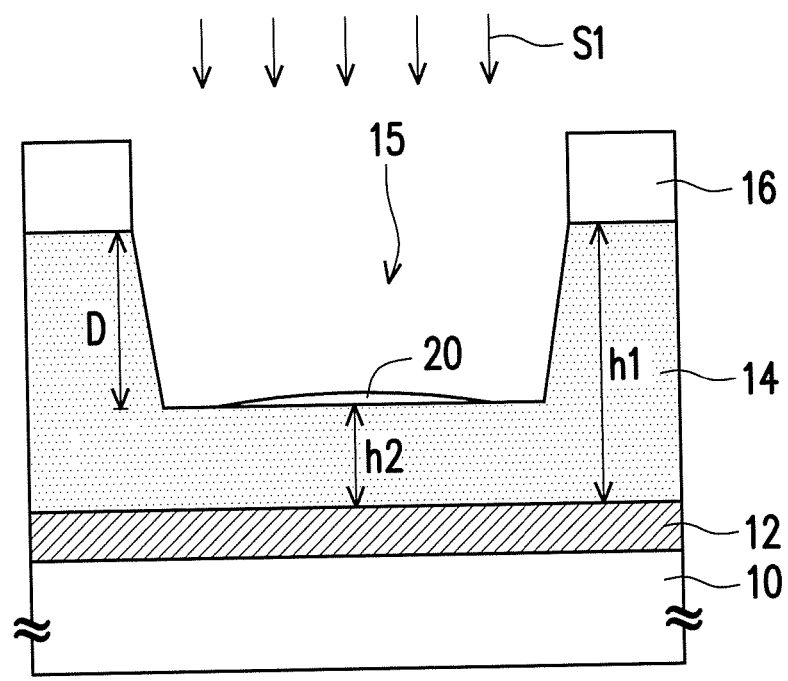

Referring to FIG. 1B, an etching process S1 is performed by using the patterned mask layer 16 as a mask, so as to remove a portion of the dielectric layer 14 and therefore form a shallow opening 15 in the dielectric layer 14. The etching process S1 includes an anisotropic etching process, such as a dry etching process. The dry etching process can be a plasma etching process. In this embodiment, the etching process S1 can be a high radio frequency power (RF power) plasma etching process, in which the energy ranges from about 1,000 watts to 5,000 watts. The etching gases used in the etching process S1 include $SF_6$, $NF_3$, Ar and $C_xF_y$, wherein each of x and y is greater than zero, and in an embodiment, x is an integer from 1 to 5, and y is an integer from 4 to 8. $C_xF_y$ can include fluorinated alkanes, fluorinated alkenes or fluorinated alkynes. In an embodiment, the etching gases used in the etching process S1 do not contain nitrogen.

It is noted that, during the step of forming the shallow opening 15 in the dielectric layer 14, a deposit 20 is simultaneously formed on dielectric layer 14 at the bottom of the shallow opening 15. The deposit 20 can include polymer residues formed from the etching gases in the etching process S1.

The depth D of the shallow opening 15 is about ½ to ⅘ of the thickness h1 of the dielectric layer 14. Specifically, the shallow opening 15 does not penetrate through the dielectric layer 14, and the total of the depth D of the shallow opening 15 and the thickness h2 of the dielectric layer 14 below the shallow opening 15 is substantially equal to the thickness h1 of the dielectric layer 14. In an embodiment, the thickness h1 of the dielectric layer 14 ranges from about 8,000 Å to 15,000 Å, and the depth D of the shallow opening 15 ranges from about 4,000 Å to 12,000 Å, for example. However, the said ranges are provided for illustration purposes, and are not construed as limiting the present invention.

Figure 1C:
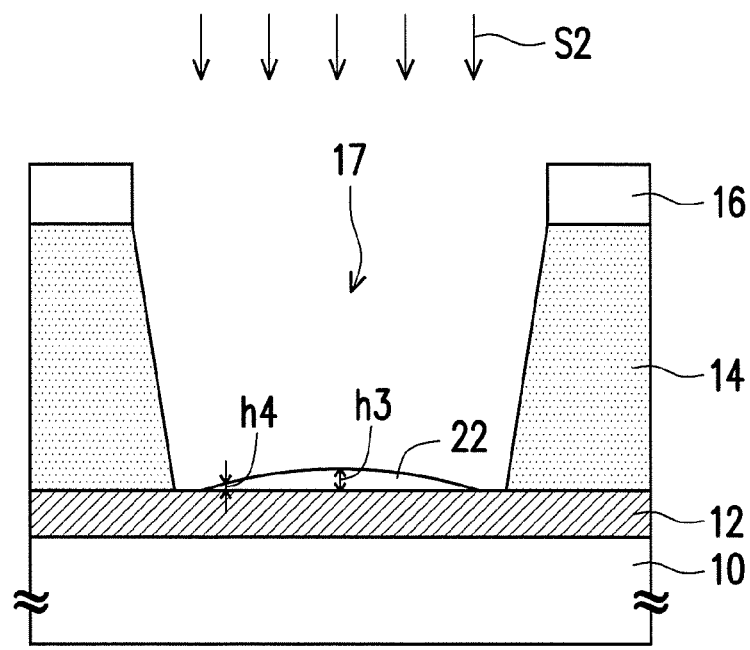

Referring to FIG. 1C, an etching process S2 is performed by using the patterned mask layer 16 as a mask, so as to deepen the shallow opening 15 and therefore form an opening 17 in dielectric layer 14. The opening 17 exposes a portion of the barrier layer 12. Besides, a protection layer 22 is formed on the barrier layer 12 at the bottom of the opening 17. The etching process S2 includes an anisotropic etching process, such as a dry etching process. The dry etching can be a plasma etching process. The etching process S2 uses etching gases different from those of the etching process S1. The etching gases used in the etching process S2 contain nitrogen, while the etching gases used in the etching process S1 do not contain nitrogen. In an embodiment, the etching process S2 can be a high RF power plasma etching process, in which the energy ranges from about 1,000 watts to 5,000 watts. The etching gases used in the etching process S2 include $SF_6$, $NF_3$, Ar, $C_xF_y$, and nitrogen, wherein each of x and y is greater than zero, and in an embodiment, x is an integer from 1 to 5, and y is an integer from 4 to 8. Besides, the flow rate ratio of nitrogen to $C_xF_y$ is about 1:6 to 1:4, for example.

In an embodiment, during the step of forming the opening 17, the nitrogen flow rate is increased as the opening 17 is deepened. For example, in the etching process S2, the initial nitrogen flow rate is about 0 sccm to 50 sccm. Thereafter, as the opening 17 is deepened, the nitrogen flow rate is adjusted to about 50 sccm to 300 sccm. However, the present invention is not limited thereto. It is appreciated by people having ordinary skill in the rat that the nitrogen flow rate can be adjusted upon the process requirements.

In an embodiment, during the etching process S2, the opening 17 is formed in the dielectric layer 14, and the protection layer 22 is simultaneously formed on the barrier layer 12 at the bottom of the opening 17. In other words, the protection layer 22 and the opening 17 are formed at the same time. In this embodiment, the protection layer 22 can include polymer residues formed from the etching gases in the etching process S2. The protection layer 22 includes a polymer containing carbon, fluorine and nitrogen. In an embodiment, the protection layer 22 includes a $C_xF_yN_z$ polymer, wherein each of x, y and z is greater than zero. The protection layer 22 can have a uniform or uneven thickness. In an embodiment, the thickness h3 of protection layer 22 at the central portion can be greater than the thickness h4 of the protection layer 22 at the edge portion. In another embodiment, the protection layer 22 covers a portion of the barrier layer 12, while exposes another portion of the barrier layer 12 adjacent to the sidewall of the opening 17. Alternatively, the protection layer 22 can be very thin at the edge portion thereof, so the edge portion of the protection layer and the underlying barrier layer 12 can be removed in the subsequent etching process.

Figure 1D:
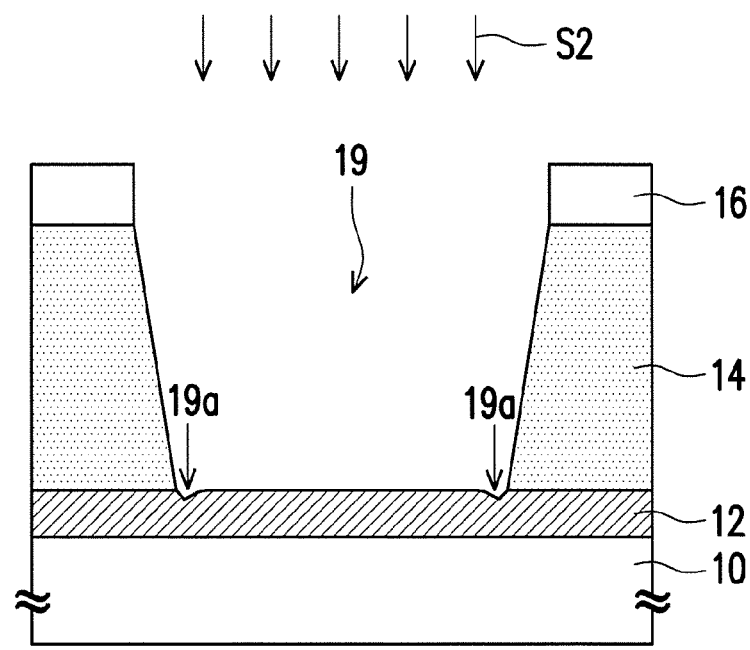
Figure 1E:
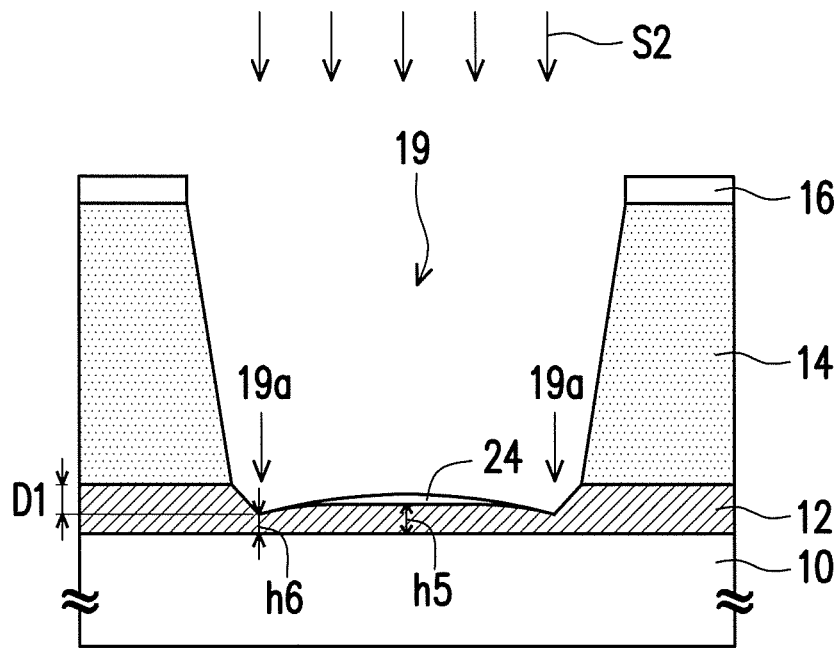

Referring to FIG. 1D and FIG. 1E, a portion of the barrier layer 12 is removed by using the protection layer 22 and the patterned mask layer 16 as a mask, so as to form an opening 19 in the dielectric layer 14. The opening 19 penetrates through the dielectric layer 14. Specifically, the protection layer 22 is gradually consumed during the step of forming the opening 19, and at least one sub-opening 19a is simultaneously formed in the barrier layer 12 in at least one side of the protection layer 22, as shown in 1D. In an embodiment, the sub-opening 19a is configured to surround the protection layer 22. When the protection layer 22 is completely consumed, a portion of the barrier layer 12 at the central bottom of the opening 19 is removed and the sub-opening 19a is deepened, as shown in FIG. 1E. In an embodiment, during the step in FIG. 1E, a protection layer 24 can be simultaneously formed on the barrier layer 12 at the central bottom of the opening 19. The protection layer 24 can include a material similar to that of the protection layer 22. Specifically, the protection layers 22 and 24 have the same major constituents (e.g. C, F and N), but the atomic ratios thereof are different. In an embodiment, the bottom of the opening 19 has a W-shaped cross section. The opening 19 can have at least one sub-opening 19a. The sub-opening 19a can be disposed in a portion of the barrier layer 12 adjacent to the sidewall of the opening 19. The depth D1 of the sub-opening 19a is about ⅓ to ⅔ of thickness of barrier layer 12, for example. In this embodiment, the thickness h5 of the barrier layer 12 at the central bottom of the opening 19 is greater than the thickness h6 of the barrier layer 12 below the sub-opening 19a. Besides, the thickness h7 of the barrier layer 12 below the dielectric layer 14 is greater than the thickness h5 of the barrier layer 12 at the central bottom of the opening 19.

In this embodiment, the etching process S2 can include the steps of forming the openings 17 and 19. Specifically, in the said method, the nitrogen flow rate is increased as the opening 17 is deepened. When the opening 17 is deepened to expose a portion of the barrier layer 12, a portion of the barrier layer 12 in at least one side of the protection layer 22 is removed by using the protection layer 22 as a mask, so as to form the opening 19 with at least one sub-opening 19a. The nitrogen flow rate during the step of forming the opening 19 ranges from about 50 sccm to 300 sccm, for example. By adjusting the nitrogen flow rate, the opening 19 can be formed with a W-shaped bottom in cross section.

It is noted that, in the said etching process S2, the protection layers 22/24 can prevent the barrier layer 12 from being sputtered onto the sidewalls of the openings 17/19 when a high RF power plasma is used, and thus, residues are not found on the sidewalls of the openings 17/19.

Figure 1F:
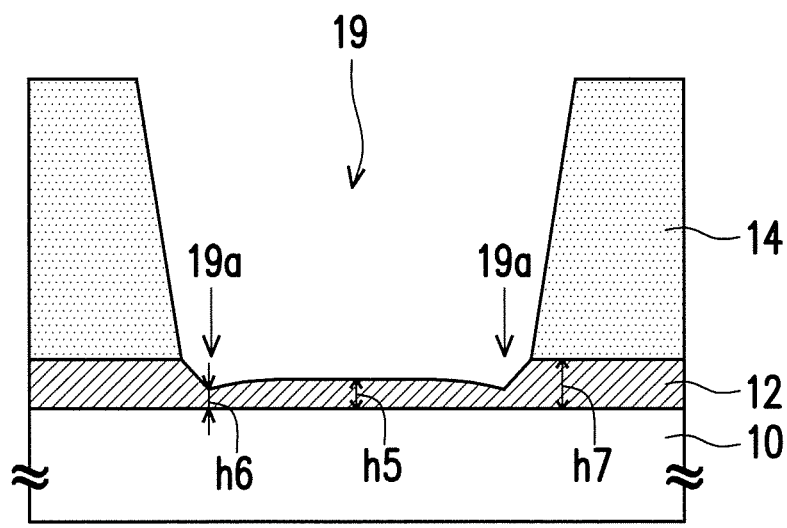

Referring to FIG. 1F, the protection layer 24 and the patterned mask layer 16 are removed. The removing step includes performing a wet etching process.

Figure 1G:
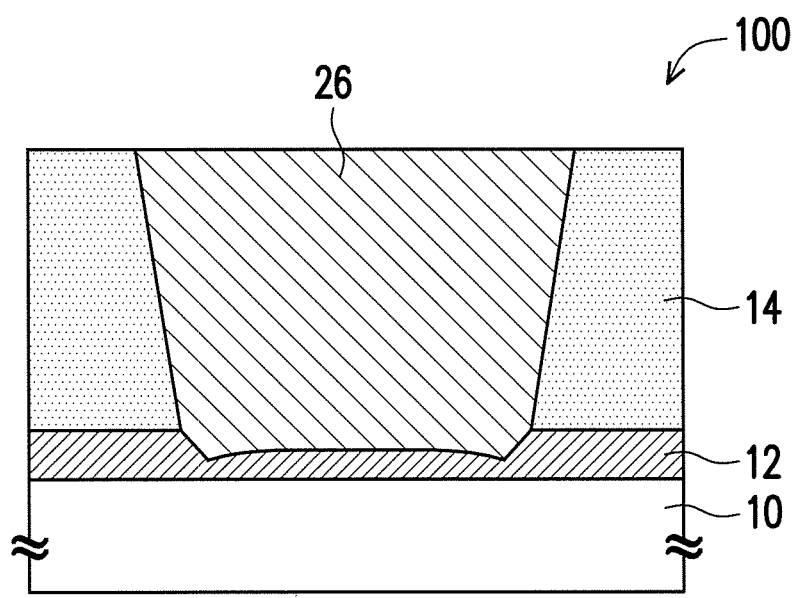

Referring to FIG. 1G, a conductive layer 26 is formed in the opening 19. The conductive layer 26 includes metal, metal alloy, doped polysilicon or a combination thereof. The metal includes tungsten. The metal alloy includes Al—Si alloy. The method of forming the conductive layer 26 includes performing a CVD process. Besides, another barrier layer (not shown) can be formed on the sidewall and bottom of the opening 19 before the formation of the conductive layer 26. The another barrier layer includes Ti, TiN, Ta, TaN, W, WN or a combination thereof. In an embodiment, the another barrier layer includes a combination of Ti and TiN. In another embodiment, the another barrier layer includes a combination of Ta and TaN. The method of forming the another barrier layer includes performing a CVD process or a PVD process. The another barrier layer has a thickness of about 10 Å to 100 Å, for example. The semiconductor device 100 of the present invention is thus completed.

The semiconductor device structure of the invention is described with reference to FIG. 1F in the following. As shown in FIG. 1F, a semiconductor device of the invention includes a substrate 10, a barrier layer 12 and a dielectric layer 14. The barrier layer 12 is disposed on the substrate 10, and the dielectric layer 14 is disposed on the barrier layer 12. The dielectric layer 14 has an opening 19 therein, and the opening 19 exposes a portion of the barrier layer 12. The opening 19 has at least one sub-opening 19a disposed in the barrier layer 12 adjacent to the sidewall of the opening 19. In an embodiment, when the opening 19 is a via opening or a contact opening, one sub-opening 19a can be disposed in the barrier layer 12 along the bottom periphery of the opening 19. In another embodiment, when the opening 19 is a trench-type opening, two sub-openings 19a can be disposed in the barrier layer respectively along opposite sides of the bottom of the opening 19. In either case, the bottom of the opening 19 has a W-shaped cross section.

The thickness h5 of the barrier layer 12 at the central bottom of the opening 19 is greater than the thickness h6 of the barrier layer 12 below the sub-opening 19a. Besides, the thickness h7 of the barrier layer 12 below the dielectric layer 14 is greater than the thickness h5 of the barrier layer 12 at the central bottom of the opening 19. That is, h7>h5>h6. In an embodiment, h7 ranges from about 50 nm to 100 nm, h6 ranges from about 15 nm to 75 nm, and h5 ranges from about 25 nm to 100 nm, for example.

The method of the invention can be applied to, for example but not limited to, a dynamic random access memory (DRAM), a NAND-flash memory, NOR-flash memory etc.

Figure 2:
FIG. 2 is a TEM image of a semiconductor device according to an embodiment of the present invention.

FIG. 2 is a TEM image of a semiconductor device according to an embodiment of the present invention.

As shown in FIG. 2, the thickness h8 of the barrier layer at the central bottom of the opening is greater than the thickness h9 of the barrier layer below the sub-opening.

In summary, in the method of the invention, an etching process is conducted to form a U-shaped opening (e.g. opening 17), and a protection layer is simultaneously formed on the barrier layer at the bottom of the U-shaped opening. The said etching process is continued by using the protection layer as a mask and the nitrogen flow rate is adjusted, and a W-shaped opening (e.g. opening 19) is thus formed. The protection layer can prevent the barrier layer from being sputtered onto the sidewall of the opening when a high RF power plasma is used. Thus, residues are not observed on the sidewall of the opening, and the device performance is accordingly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
   a substrate;
   a barrier layer located on the substrate; and
   a dielectric layer, disposed on the barrier layer, wherein the dielectric layer has an opening therein, and the opening exposes a portion of the barrier layer,
   wherein the substrate having an upper surface vertically above and spaced apart from a lower surface of the dielectric layer, therein the barrier layer extends vertically between and overlaps horizontally with said upper surface and said lower surface,
   wherein the opening has at least one sub-opening disposed in the barrier layer adjacent to a sidewall of the opening and a thickness of the barrier layer at a central bottom of the opening measured in a vertical direction is greater than a thickness of the barrier layer below the sub-opening measured in the vertical direction, and a thickness of the barrier layer below the dielectric layer measured in the vertical direction is greater than the thickness of the barrier layer at the central bottom of the opening measured in the vertical direction,
   wherein the sub-opening is smaller than the opening in a horizontal direction.

2. The semiconductor device of claim 1, wherein a bottom of the opening has a W-shaped cross section.

3. The semiconductor device of claim 1, wherein a depth of the sub-opening ranges from about 4,000 Å to 12,000 Å.

4. The semiconductor device of claim 1, wherein the barrier layer comprises Ti, TiN, Ta, TaN, W, WN or a combination thereof.

* * * * *